United States Patent
Lee et al.

(10) Patent No.: US 10,916,684 B2
(45) Date of Patent: *Feb. 9, 2021

(54) LIGHT EMITTING DEVICE INCLUDING RGB LIGHT EMITTING DIODES AND PHOSPHOR

(71) Applicant: Seoul Semiconductor Co., Ltd., Ansan-si (KR)

(72) Inventors: Chung-Hoon Lee, Gwangmyeong-Si (KR); Gundula Roth, Levenhagen (DE); Walter Tews, Greifswald (DE)

(73) Assignee: Seoul Semiconductor Co., Ltd., Ansan-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/356,475

(22) Filed: Mar. 18, 2019

(65) Prior Publication Data
US 2019/0214534 A1 Jul. 11, 2019

Related U.S. Application Data

(63) Continuation of application No. 16/232,987, filed on Dec. 26, 2018, now Pat. No. 10,672,956, which is a
(Continued)

(30) Foreign Application Priority Data
May 13, 2004 (KR) .................. KR10-2004-0034001

(51) Int. Cl.
*H01L 33/50* (2010.01)
*H01L 33/52* (2010.01)
(Continued)

(52) U.S. Cl.
CPC ........ *H01L 33/504* (2013.01); *H01L 25/0753* (2013.01); *H01L 33/52* (2013.01);
(Continued)

(58) Field of Classification Search
CPC ....... H01L 33/504; H01L 33/52; H01L 33/64; H01L 33/486; H01L 33/50;
(Continued)

(56) References Cited

U.S. PATENT DOCUMENTS

| 2,110,162 A | 3/1938 | Leverenz |
| 2,402,760 A | 6/1946 | Leverenz |

(Continued)

FOREIGN PATENT DOCUMENTS

| AT | 410266 | 3/2003 |
| CN | 1218084 | 6/1999 |

(Continued)

OTHER PUBLICATIONS

Non-final office action dated Nov. 17, 2009 issued in U.S. Appl. No. 12/097,741, filed Oct. 9, 2008.
(Continued)

*Primary Examiner* — Timor Karimy
(74) *Attorney, Agent, or Firm* — H.C. Park & Associates, PLC

(57) ABSTRACT

A light emitting device including a plurality light emitting diodes configured to produce a primary light; a wavelength conversion means configured to at least partially convert the primary light into secondary light having peak emission wavelength ranges between 450 nm and 520 nm, between 500 nm and 570 nm, and between 570 nm and 680 nm; and a molded part to enclose the light emitting diodes and the wavelength conversion means.

9 Claims, 4 Drawing Sheets

Related U.S. Application Data continuation of application No. 14/934,798, filed on Nov. 6, 2015, now Pat. No. 10,186,642, which is a continuation of application No. 11/569,060, filed as application No. PCT/KR2005/001288 on May 3, 2005, now Pat. No. 9,209,162.

(51) Int. Cl.
*H01L 33/64* (2010.01)
*H01L 25/075* (2006.01)
*H01L 33/48* (2010.01)

(52) U.S. Cl.
CPC ............ *H01L 33/64* (2013.01); *H01L 33/486* (2013.01); *H01L 33/50* (2013.01); *H01L 2224/32013* (2013.01); *H01L 2224/32245* (2013.01); *H01L 2224/48091* (2013.01); *H01L 2224/48247* (2013.01); *H01L 2224/73265* (2013.01); *H01L 2224/8592* (2013.01)

(58) Field of Classification Search
CPC ....... H01L 25/0753; H01L 2224/32013; H01L 2224/32245; H01L 2224/48091; H01L 2224/48247; H01L 2224/73265; H01L 2224/8592
See application file for complete search history.

(56) References Cited

U.S. PATENT DOCUMENTS

| | | | |
|---|---|---|---|
| 2,570,136 A | 10/1951 | Lyon | |
| 2,617,773 A | 11/1952 | Nagy et al. | |
| 2,719,128 A | 9/1955 | Kressin | |
| 2,780,600 A | 2/1957 | Wollentin | |
| 3,143,510 A | 8/1964 | Bakker | |
| 3,598,752 A | 8/1971 | Sisneros et al. | |
| 3,644,212 A | 2/1972 | McAllister et al. | |
| 3,893,939 A | 7/1975 | DeKalb et al. | |
| 3,905,911 A | 9/1975 | Kelsey et al. | |
| 4,215,289 A | 7/1980 | De Hair et al. | |
| 4,770,950 A | 9/1988 | Ohnishi | |
| 4,972,086 A | 11/1990 | Bryan et al. | |
| 5,032,316 A | 7/1991 | Takahashi et al. | |
| 5,433,295 A | 7/1995 | Murphy | |
| 5,472,636 A | 12/1995 | Forster et al. | |
| 5,518,808 A | 5/1996 | Bruno et al. | |
| 5,770,110 A | 6/1998 | Schrell et al. | |
| 5,770,111 A | 6/1998 | Moriyama et al. | |
| 5,853,614 A | 12/1998 | Hao et al. | |
| 5,952,681 A | 9/1999 | Chen | |
| 5,965,192 A | 10/1999 | Potter | |
| 5,998,925 A | 12/1999 | Shimizu et al. | |
| 6,045,722 A | 4/2000 | Leblans et al. | |
| 6,066,861 A | 5/2000 | Hahn et al. | |
| 6,357,889 B1 | 3/2002 | Duggal et al. | |
| 6,373,184 B1 | 4/2002 | Suh et al. | |
| 6,472,765 B1 | 10/2002 | Sana et al. | |
| 6,482,664 B1 | 11/2002 | Lee et al. | |
| 6,565,771 B1 | 5/2003 | Ono et al. | |
| 6,670,751 B2 | 12/2003 | Song et al. | |
| 6,686,691 B1 | 2/2004 | Mueller | |
| 6,842,664 B2 | 1/2005 | Harada et al. | |
| 6,982,045 B2 | 1/2006 | Menkara et al. | |
| 6,982,048 B1 | 1/2006 | Atwater | |
| 6,987,353 B2 | 1/2006 | Menkara et al. | |
| 7,019,335 B2 | 3/2006 | Suenaga | |
| 7,029,602 B2 | 4/2006 | Oshio | |
| 7,045,078 B2 | 5/2006 | Choi | |
| 7,138,770 B2 | 11/2006 | Uang et al. | |
| 7,189,340 B2 | 3/2007 | Shimomura et al. | |
| 7,206,507 B2 | 4/2007 | Lee et al. | |
| 7,229,571 B2 | 6/2007 | Ezuhara et al. | |
| 7,244,965 B2 | 7/2007 | Andrews et al. | |
| 7,332,746 B1 | 2/2008 | Takahashi et al. | |
| 7,468,147 B2 | 12/2008 | Shida et al. | |
| 7,554,129 B2 | 6/2009 | Roth et al. | |
| 7,608,200 B2 | 10/2009 | Seto et al. | |
| 7,679,101 B2 | 3/2010 | Ota et al. | |
| 7,679,281 B2 | 3/2010 | Kim et al. | |
| 9,209,162 B2 * | 12/2015 | Lee | H01L 33/504 |
| 10,186,642 B2 * | 1/2019 | Lee | H01L 25/0753 |
| 10,672,956 B2 * | 6/2020 | Lee | H01L 33/504 |
| 2002/0015013 A1 | 2/2002 | Ragle | |
| 2003/0006702 A1 | 1/2003 | Mueller-Mach et al. | |
| 2003/0026096 A1 | 2/2003 | Ellens et al. | |
| 2003/0030063 A1 | 2/2003 | Sosniak et al. | |
| 2003/0038295 A1 | 2/2003 | Koda | |
| 2003/0080341 A1 | 5/2003 | Sakano et al. | |
| 2003/0168636 A1 | 9/2003 | Dobson et al. | |
| 2004/0051111 A1 | 3/2004 | Ota et al. | |
| 2004/0056256 A1 | 3/2004 | Bokor et al. | |
| 2004/0065894 A1 | 4/2004 | Hashimoto et al. | |
| 2004/0104391 A1 | 6/2004 | Maeda et al. | |
| 2004/0136891 A1 | 7/2004 | Kijima et al. | |
| 2004/0206970 A1 | 10/2004 | Martin | |
| 2004/0251809 A1 | 12/2004 | Shimomura | |
| 2005/0001537 A1 | 1/2005 | West et al. | |
| 2005/0029927 A1 | 2/2005 | Setlur et al. | |
| 2005/0117334 A1 | 6/2005 | Lee et al. | |
| 2005/0139846 A1 | 6/2005 | Park et al. | |
| 2005/0141048 A1 | 6/2005 | Mizutani | |
| 2005/0239227 A1 | 10/2005 | Aanegola et al. | |
| 2005/0264161 A1 | 12/2005 | Oaku et al. | |
| 2005/0274930 A1 | 12/2005 | Roth et al. | |
| 2005/0274972 A1 | 12/2005 | Roth et al. | |
| 2006/0076883 A1 | 4/2006 | Himaki et al. | |
| 2006/0158090 A1 | 7/2006 | Wang et al. | |
| 2006/0261309 A1 | 11/2006 | Li et al. | |
| 2006/0261350 A1 | 11/2006 | Kawazoe et al. | |
| 2006/0267042 A1 | 11/2006 | Izuno et al. | |
| 2007/0029526 A1 | 2/2007 | Cheng et al. | |
| 2007/0247051 A1 | 10/2007 | Kuze et al. | |
| 2008/0067472 A1 | 3/2008 | Roth et al. | |
| 2008/0067920 A1 | 3/2008 | Roth et al. | |
| 2008/0224163 A1 | 9/2008 | Roth et al. | |
| 2009/0050847 A1 | 2/2009 | Xu et al. | |
| 2009/0050849 A1 | 2/2009 | Lee et al. | |
| 2009/0134413 A1 | 5/2009 | Roth et al. | |
| 2009/0152496 A1 | 6/2009 | Roth et al. | |
| 2009/0262515 A1 | 10/2009 | Lee et al. | |
| 2009/0303694 A1 | 12/2009 | Roth et al. | |
| 2010/0002454 A1 | 1/2010 | Lee et al. | |
| 2010/0165645 A1 | 7/2010 | Lee et al. | |
| 2010/0207132 A1 | 8/2010 | Lee et al. | |

FOREIGN PATENT DOCUMENTS

| | | |
|---|---|---|
| CN | 1289454 | 3/2001 |
| CN | 1317537 | 10/2001 |
| CN | 1344777 | 4/2002 |
| CN | 1434521 | 8/2003 |
| CN | 1707819 | 12/2005 |
| DE | 10233050 | 2/2004 |
| DE | 10259946 | 7/2004 |
| EP | 0094132 | 11/1983 |
| EP | 0382295 | 8/1993 |
| EP | 0862794 | 9/1998 |
| EP | 0896994 | 2/1999 |
| EP | 1107321 | 6/2001 |
| EP | 1249873 | 10/2002 |
| EP | 1605030 | 12/2005 |
| EP | 2031038 | 3/2009 |
| GB | 1336053 | 11/1973 |
| GB | 2016034 | 9/1979 |
| JP | 31-1118 | 2/1956 |
| JP | 33-8177 | 9/1958 |
| JP | 38-6082 | 5/1963 |
| JP | 39-8803 | 5/1964 |
| JP | 47-6258 | 4/1972 |
| JP | 49-38994 | 10/1974 |
| JP | 55-135190 | 10/1980 |
| JP | 61-258892 | 11/1986 |
| JP | 62-197487 | 9/1987 |

(56) References Cited

FOREIGN PATENT DOCUMENTS

| | | |
|---|---|---|
| JP | 5-78659 | 3/1993 |
| JP | 9-40946 | 2/1997 |
| JP | 9-153644 | 2/1997 |
| JP | 2003-224306 | 6/1997 |
| JP | 11-177143 | 7/1999 |
| JP | 2001-115157 | 4/2001 |
| JP | 2001-308393 | 11/2001 |
| JP | 2002-50795 | 2/2002 |
| JP | 2002-057376 | 2/2002 |
| JP | 2002-094122 | 3/2002 |
| JP | 2002-97466 | 4/2002 |
| JP | 2002-531956 | 9/2002 |
| JP | 2002-335019 | 11/2002 |
| JP | 2002-359403 | 12/2002 |
| JP | 2002-368277 | 12/2002 |
| JP | 2002359403 | 12/2002 |
| JP | 2003-064358 | 3/2003 |
| JP | 2003-133595 | 5/2003 |
| JP | 2003-152229 | 5/2003 |
| JP | 2003-515655 | 5/2003 |
| JP | 2003-321675 | 11/2003 |
| JP | 2004-006582 | 1/2004 |
| JP | 2004-505470 | 2/2004 |
| JP | 2004-71726 | 3/2004 |
| JP | 2004-71807 | 3/2004 |
| JP | 2004-88011 | 3/2004 |
| JP | 2004-127988 | 4/2004 |
| JP | 2004-134699 | 4/2004 |
| JP | 2004-192833 | 7/2004 |
| JP | 20056-101458 | 4/2005 |
| JP | 2005-167177 | 6/2005 |
| JP | 2006-503431 | 1/2006 |
| JP | 2006-073656 | 3/2006 |
| JP | 2006-173433 | 6/2006 |
| JP | 2007-186674 | 7/2007 |
| KR | 10-232395 | 12/1999 |
| KR | 10-2001-0032450 | 4/2001 |
| KR | 10-2001-0050839 | 6/2001 |
| KR | 10-2001-0101910 | 11/2001 |
| KR | 10-2002-0000835 | 1/2002 |
| KR | 10-2002-0053975 | 7/2002 |
| KR | 10-392363 | 7/2002 |
| KR | 10-2002-0079513 | 10/2002 |
| KR | 2003-0063211 | 7/2003 |
| KR | 10-2003-0082395 | 10/2003 |
| KR | 10-0426034 | 7/2004 |
| KR | 10-2004-0088418 | 10/2004 |
| KR | 10-2005-0008426 | 1/2005 |
| KR | 10-2005-0070349 | 7/2005 |
| KR | 10-2005-0098462 | 10/2005 |
| KR | 10-2005-0106945 | 11/2005 |
| KR | 10-2005-0117164 | 12/2005 |
| KR | 10-2005-0117165 | 12/2005 |
| KR | 10-2006-004056 | 4/2006 |
| KR | 10-0626272 | 9/2006 |
| KR | 10-2006-0134728 | 12/2006 |
| KR | 10-2008-0046789 | 5/2008 |
| TW | 1328885 | 3/1999 |
| TW | 546854 | 8/2003 |
| WO | 1996-32457 | 10/1996 |
| WO | 98-05078 | 2/1998 |
| WO | 98-12757 | 3/1998 |
| WO | 9839805 | 9/1998 |
| WO | 98-42798 | 10/1998 |
| WO | 00/19546 | 4/2000 |
| WO | 2000/33390 | 6/2000 |
| WO | 2004-111156 | 4/2001 |
| WO | 01/41215 | 6/2001 |
| WO | 2001/040403 | 6/2001 |
| WO | 2002-054502 | 7/2002 |
| WO | 2002-054503 | 7/2002 |
| WO | 02-089219 | 11/2002 |
| WO | 03021691 | 3/2003 |
| WO | 2003/030274 | 4/2003 |
| WO | 2003/080763 | 10/2003 |
| WO | 2004/036962 | 4/2004 |
| WO | 2006-68359 | 10/2004 |
| WO | 2004/100275 | 11/2004 |
| WO | 2004-85570 | 12/2004 |
| WO | 2005068584 | 7/2005 |
| WO | 2005-109532 | 11/2005 |
| WO | 2006-043682 | 4/2006 |
| WO | 2006-081803 | 8/2006 |
| WO | 2006/109659 | 10/2006 |
| WO | 2007-035026 | 3/2007 |
| WO | 2007-055538 | 5/2007 |
| WO | 2007-069869 | 6/2007 |
| WO | 2007-114614 | 11/2007 |
| WO | 2009-028818 | 3/2009 |

OTHER PUBLICATIONS

Lee, Chung-Hoon, et al., Unpublished U.S. Appl. No. 12/440,001; corresponds to W02009-028818. First Published on Aug. 19, 2010.
Search Report dated Aug. 21, 2007 for EP Application No. EP041 06882.6.
Search Report dated Nov. 5, 2008 for EP Application No. EP06812549.1.
Search Report dated Feb. 2, 2009 for EP Application No. EP08014684.
Chen, R., "Developments in Luminescence and Display Materials Over the Last 100 Years as reflected in Electrochemical Society Publications", Journal of Electrochemical Society, Aug. 6, 2002, 149, pp. 69-78.
G. Blasse, B.C. Grabmeier, "Luminescent Materials", Springer, 1994, pp. 40-47.
G. Blasse and A. Bril, "Characteristic Luminescence", Philips Technical Review, 31 (1970) 304, pp. 306 & 310.
S. Shionoya, W.M. Yen, "Phosphor Handbook" CRC Press, 1999, Ch. 3.3, pp. 179-182.
G. Blasse, B.C. Grabmeier, "Luminescent Materials", Springer, 1994, p. 25.
J. Garcia Sole, L.E. Bausa, D. Jaque, "An Introduction to the Optical Spectroscopy of Inorganic Solids", Wiley, 2005, pp. 163-164.
P.A. Cox, "Transition Metal Oxides", Oxford University Press, 1995, p. 1 05.
G.L. Miessler, D.A. Tarr, "Inorganic Chemistry", 2004, 3rd ed., Pearson/ Prentice Hall, pp. 117-118.
B. Cordero, et al. "Covalent Radii Revisited", Dalton Trans., (2008), pp. 2832-2838.
G. Blasse, B.C. Grabmeier, "Luminescent Materials", Springer, 1994, pp. 87-90.
Feldman, C., "Inorganic Luminescent Materials: 100 Years of Research and Application", Adv. Funct. Matter, 2003, pp. 511-516.
Blasse, G., "Characteristic Luminescence", Philips Technical Review, vol. 31 (1970), pp. 304-332.
Declaration Under Rule 37 CFR 1.132 of Ulrich Kynast dated Sep. 6, 2008.
Shionoya, "Phosphor Handbook", 1999, CRC Press, pp. 183-184.
Garcia Sole, et al., "An Introduction to the Optical Spectroscopy of Inorganic Solids", 2005, pp. 132-133.
R.J. Angel et al., "Structure and twinning of single-crystal MgSi03 garnet synthesized at 17 GPa and 1800 •c", American Mineralogist, 74 (1989) pp. 509-512.
Lee, Chung-Hoon, et al., Unpublished U.S. Appl. No. 12/491,780. First Published on Jul. 1, 2010.
Non-final office action dated Nov. 2, 2009 issued in U.S. Appl. No. 12/098,263, filed Apr. 4, 2008.
Non-final office action dated Nov. 14, 2008 issued in U.S. Appl. No. 11/024,722, filed Dec. 30, 2004.
Non-final office action dated May 29, 2009 issued in U.S. Appl. No. 11/024,722, filed Dec. 30, 2004.
Final office action dated Oct. 28, 2009 issued in U.S. Appl. No. 11/024,722, filed Dec. 30, 2004.
Non-final office action dated Nov. 29, 2006 issued in U.S. Appl. No. 11/024,722, filed Dec. 30, 2004.
Non-final office action dated Nov. 29, 2007 issued in U.S. Appl. No. 11/024,702, filed Dec. 30, 2004.

(56) References Cited

OTHER PUBLICATIONS

Non-final office action dated Jun. 22, 2006 issued in U.S. Appl. No. 11/024,702, filed Dec. 30, 2004.
Final office action dated Feb. 7, 2007 issued in U.S. Appl. No. 11/024,702, filed Dec. 30, 2004.
Notice of Allowance dated May 4, 2009 issued in U.S. Appl. No. 11/024,702.
English language abstract of Japanese Publication No. 2002-359403.
Chinese Office Action corresponding to Patent Application No. 2005800150173 dated Dec. 28, 2007.
European Search Report of EP 10 16 4970 dated Sep. 23, 2010.
Non-Final Office Action dated Aug. 10, 2010 in U.S. Appl. No. 12/731,811.
Non-Final Office Action dated Aug. 18, 2010 in U.S. Appl. No. 11/948,813.
CN Office Action dated Feb. 5, 2010 in CN Appl. No. 2005100023042.
Final Office Action dated Sep. 9, 2010 in U.S. Appl. No. 11/568,769.
Non-Final Office Action dated Apr. 30, 2010 in U.S. Appl. No. 11/568,769.
Non Final Office Action dated Jun. 16, 2010 in U.S. Appl. No. 12/097,741.
Non-Final Office Action dated Aug. 10, 2010 in U.S. Appl. No. 11/024,722.
Final Office Action dated Nov. 12, 2010 in U.S. Appl. No. 12/097,741.
TW Office Action of Sep. 10, 2010 in TW Patent Appl. No. 098123458.
EP Search Report dated Oct. 6, 2010 in EP Appl No. 07745750.5—corresponding to U.S. Appl. No. 12/295,438.
EP Search Report dated Sep. 1, 2010 in EP Appl No. 08015119 correpsonding to U.S. Appl. No. 12/440,001.
Non Final Office Action dated Aug. 17, 2010 in U.S. Appl. No. 11/948,845.
Non Final Office Action dated Nov. 30, 2010 in U.S. Appl. No. 12/196,923.
Final Office Action dated Nov. 30, 2010 in U.S. Appl. No. 11/024,722.
Non Final Office Action dated Nov. 24, 2010 in U.S. Appl. No. 12/093,441.
Non Final Office Action dated Nov. 26, 2010 in U.S. Appl. No. 12/440,001.
EP Search Report for EP 05 74 0759 dated Jul. 26, 2011.
EP Search Report for EP 05 74 0758 dated Jul. 26, 2011.
Notice of Allowance dated Aug. 18, 2010 issued in U.S. Appl. No. 12/098,263.
IP Australia Office Action dated Jul. 2, 2010 for AU Patent Appl. No. 2005-319965, corresponding to U.S. Appl. No. 12/098,263.
Non Final Office Action dated Mar. 17, 2010 in U.S. Appl. No. 11/024,722.
Final Office Action dated May 11, 2010 in U.S. Appl. No. 12/098,263.
Final Office Action dated Dec. 7m, 2010 in U.S. Appl. No. 11/948,845.
Non Final Office Action dated Dec. 29, 2010 in U.S. Appl. No. 12/731,811.
Final Office Action dated Dec. 23, 2010 in U.S. Appl. No. 11/569,060.
Final Office Action dated Dec. 8, 2010 in U.S. Appl. No. 11/948,813.
International Search Report for PCT/KR2010/003302 dated Jan. 3, 2011, corresponding to U.S. Appl. No. 12/767,253.
Non-Final Office Action dated Aug. 8, 2009 in U.S. Appl. No. 11/569,060.
Non-Final Office Action dated Jan. 13, 2010 in U.S. Appl. No. 11/569,060.
Final Office Action dated Jun. 21, 2010 in U.S. Appl. No. 11/569,060.
Non-Final Office Action dated Dec. 23, 2010 in U.S. Appl. No. 11/569,060.
Final Office Action dated Jul. 13, 2011 in U.S. Appl. No. 11/569,060.
Notice of Allowance dated Aug. 4, 2015 in U.S. Appl. No. 11/569,060.
European Office Action dated Sep. 18, 2015, in European Application No. 05740759.5.
Non-Final Office Action dated Oct. 11, 2016 in U.S. Appl. No. 14/934,798.
Final Office Action dated Jan. 23, 2017 in U.S. Appl. No. 14/934,798.
Non-Final Office Action dated Jul. 13, 2017 in U.S. Appl. No. 14/934,798.
Final Office Action dated Dec. 12, 2017 in U.S. Appl. No. 14/934,798.
Non-Final Office Action dated Jun. 29, 2018 in U.S. Appl. No. 14/934,798.
Notice of Allowance dated Sep. 13, 2018 in U.S. Appl. No. 14/934,798.
International Search Report dated Feb. 11, 2009 for PCT Application No. PCT/2008/004733.
Butler, "Fluorescent Lamp Phosphors", The Pennsylvania State University Press, 1980, pp. 281-284.
Wan Maker, "Luminescence of Copper-Activated Orthophosphates of the Type ABPO (A=Ca,Sr or Ba and B=Li,Na or K)", Journal of the Electrochemical Society, pp. 1 09-113.
Shionoya, "Phosphor Handbook", edited under the auspiece of Phosphor Research Society, CRC Press, 1999, pp. 238-239, 241.
Van Gool, Philips Res. Rept. Suppl., 3, 1, 1961(pp. 1-9, 30-51, 84-85).
Wan Maker, "Luminescence of Copper-Activated Calcium and Strontium Orthophosphates", Journal of the Electrochemical Society, pp. 1027-1031.
Shionoya, "Phosphor Handbook", edited under the auspiece of Phosphor Research Society, CRC Press, 1999, pp. 204-205.
Blasse, "Radiationless Processes in Luminescent Materials", Radiationless Processes, 1980, pp. 287-289, 293.
Butler, "Fluorescent Lamp Phosphors", The Pennsylvania State University Press, 1980, pp. 181-182.
Butler, "Fluorescent Lamp Phosphors", The Pennsylvania State University Press, 1980, pp. 175-176.
Bernhardt, Investigations of the Orange Luminescence of PbMo04 Crystals, Phys. Stat.Sol.(a),91 ,643, 1985, pp. 643-647.
Shionoya, S., et ai.(Eds.), "Principal phosphor materials and their optical properties" in Phosphor Handbook, CRC Press, 1999, p. 826.
Ralchenko, Yu., Kramida, A.E., Reader, J. and NIST ASD Team (2008). NIST Atomic Spectra Database (version 13 3.1.5), [Online]. Available: http://physics.nist.gov/asd3 [Feb. 27, 2009]. National Institute of Standards and Technology, Gaithersburg, MD.
Yang, "Conversion Fluorescence in Er3+Yb3+Co-Doped Oxy-Fiuoride Compound Materials Based on Ge02," Natural Science Journal of Xiangtan University, vol. 23, No. 2, 2001, pp. 37-41.
International Search Report dated Feb. 27, 2009 for PCT Application No. PCT/KR2008/004734.
X.W.Sun, et al. "Pulsed Laser Deposition of Silicate Phosphor Thin Films", Appl. Phys. A, 69, 1999, 5 pages.
W.L. Wanmaker, et al. "Luminescence of Phosphors Based on the Host Lattice ABGe206(a,B=Ca,Sr,Ba)" Journal of Solid State Chemistry 3, (1971), pp. 194-196.
N. S. Akhmetov, "Inorganic Chemistry", Moscow "Vysshaya Shkola", 1975; (partial translation; translated pp. 332-3, 372-3, 384-5, 427, 432, 436, 445, 471' 476, 486, 491' 496-7, 501' 546-9).
Markovsky L, Ya. et al., Phosphors (Moscow-Leningrad, KHIMIYA Publishers, 1966, p. 7 (partial translation).
Joung Kyu Park, et al., "Silicate Phosphors for White LEOs Identified Through Combinatorial Chemistry", Electrochemical and Solid-State Letters, vol. 10(2), pp. J15-J18, (2007), XP-00251106706-11-12).
Joung Kyu Park, et al., "Luminescence Characteristics of Yellow Emitting Ba3Si05:EU2+ Phosphor", Journal of Materials Science 40 (2005), pp. 2069-2071, XP-002511068.
H.G. Kang, et al., Embodiment and Luminescence Properties of Sr3Si05:Eu(yellow-orange phosphor) by co-doping lanthanide, Solid State Phenomena, vol. 124-126 (2007) pp. 511-514.
G. Roth, et al. "Advanced Silicate Phosphors for improved white LED", Global Phosphor Summit Seoul/Korea, Mar. 5-7, 2007.
T.L. Barry, "Equilibria and Eu2+ luminescence of subsolidus phases bounded by Ba3MgSi208, Sr3MgSi208 and Ca3MgSi208," J. Electrochem. Soc., vol. 115 No. 7 (Jul. 1968), pp. 733-738.
G. Blasse, et al., "Fluorescence of Europium2+-activated silicates," Philips Res. Repts 23 (1968), pp. 189-199.
S.D. Jee, et al., "Photoluminescence properties of Eu2+-activated Sr3Si05 Phosphors," J. Mater. Sci. 41 (2006), pp. 3139-3141.

(56) References Cited

OTHER PUBLICATIONS

T.L. Barry, "Fluorescence of Eu2+ Activated Phases in Binary Alkaline Earth Orthosilicate Systems", J. Electrochem Soc., Nov. 1968, pp. 1181-1184.
Shenstone, A. G., "The Third Spectrum of Copper(Cu III)", Journal of Research of the National Bureau of Standards-A. Physics and Chemistry, vol. 79A, No. 3, May-Jun. 1975, pp. 497-521.
Lever, A.B.P., "Inorganic Electronic Spectroscopy", 2nd ed., Elsevier, 1984, pp. 355 and 557-559.
Dubicki, Lujcan et al., "The First d-d Fluorescence of a six-Coordinate Copper(II) Ion", J.Am.Chem.Soc., 1989, No. 111 pp. 3452-3454.
Scacco, A., et al., "Optical Spectra of Cu2+ Ions in LiF Crystals", Radiation Effects and Defects in Solids, vol. 134, 1995, pp. 333-336.
Shionoya, S., et al.(Eds.), "Principal phosphor materials and their optical properties" in Phosphor Handbook, CRC Press, 1999, pp. 231-255.
Yang, Ping et al., "Photoluminescence of Cu+ doped and Cu2+ doped ZnS nanocrystrallites", Journal of Physics and Chemistry of Solids, No. 63, 2002, pp. 639-643.
Suyver, J.F., et ai.,"Luminescence of nanocrystalline ZnSe:Cu", Applied Physics Letters, vol. 79, No. 25, Dec. 17, 2001 pp. 4222-4224.
Bol, Ageeth A., et al., "Luminescence of nanocrystalline ZnS:Cu2+", Journal of Luminescence, No. 99, 2002, pp. 325-334.
Non-final office action dated May 23, 2007 for U.S. Appl. No. 11/024,722, filed Dec. 30, 2004.
Declaration under 37 CFR 1.132 by Ulrich Kynast, dated Aug. 24, 2007.
Final office action dated Oct. 22, 2007 issued in U.S. Appl. No. 11/024,722, filed Dec. 30, 2004.
"Phosphors for Mercury Lamps" https:lwww.lamptech.co.ukldocuments/M14%20Phosphors.htm 2003 (2 pages).
European Search Report dated Apr. 11, 2006 for EP Application No. EP04106880.0.
International Search Report dated Aug. 12, 2005 for PCT Application No. PCT/KR2005/001287.
International Search Report dated Aug. 12, 2005 for PCT Application No. PCT/KR2005/001288.
International Search Report dated Oct. 13, 2005 for PCT Application No. PCT/KR2005/002333.
International Search Report dated Oct. 24, 2005 for PCT Application No. PCT/KR2005/002332.
International Search Report dated Feb. 20, 2007 for PCT Application No. PCT/KR2006/004716.
International Search Report dated Jul. 12, 2007 for PCT Application No. PCT/KR2007/001587.
International Search Report dated Mar. 21, 2007 for PCT Application No. PCT/KR2006/005500.
First Office Action of the State Intellectual Property Office of the PRC corresponding to Chinese Patent Application No. 200510002304.2 dated Feb. 15, 2008 (corresponds to U.S. Appl. No. 11/024,722).
First Office Action of the State Intellectual Property Office of the PRC corresponding to Chinese Patent Application No. 200580016844.4 dated Dec. 28, 2007 (corresponds to U.S. Appl. No. 11/568,769).
Partial European Search Report of EP 10 17 7817 dated Oct. 26, 2010.
Non-Final Office Action dated Oct. 21, 2019, in U.S. Appl. No. 16/232,987.

\* cited by examiner

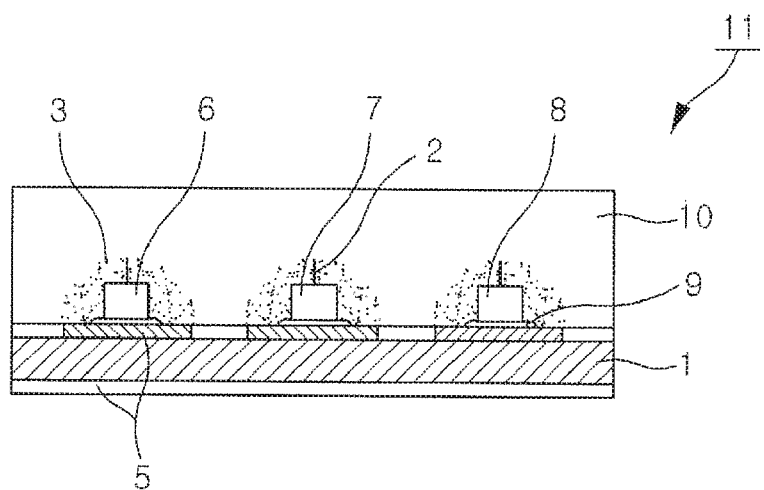
[Fig. 1]
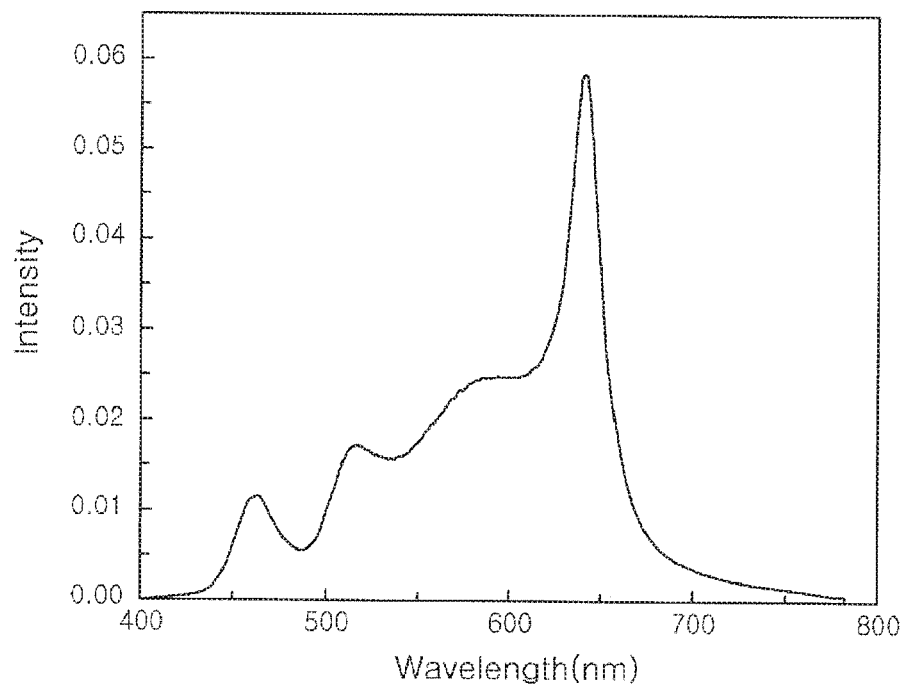
[Fig. 2]

[Fig. 3]
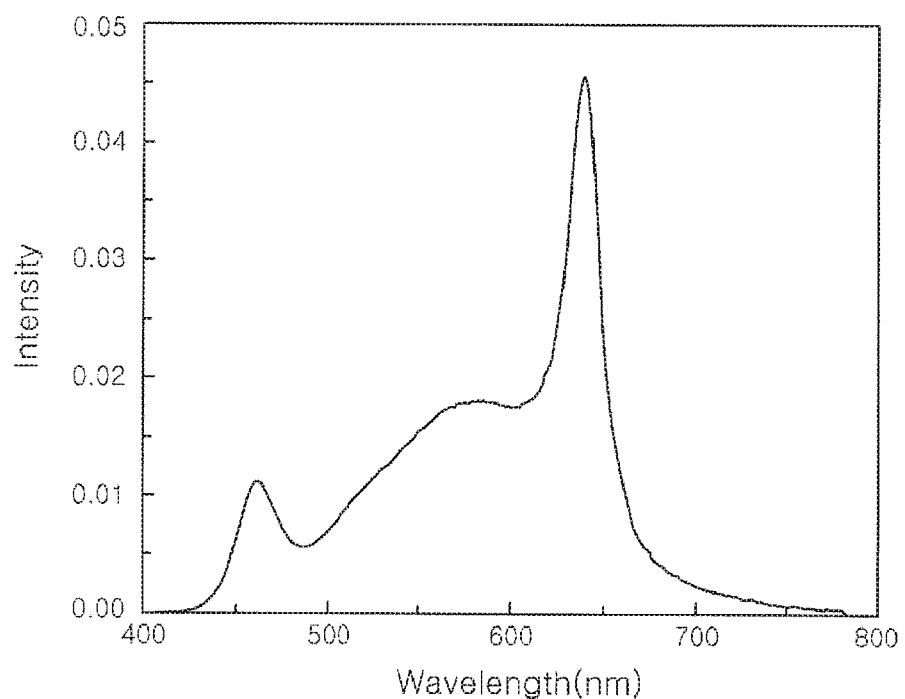
[Fig. 4]
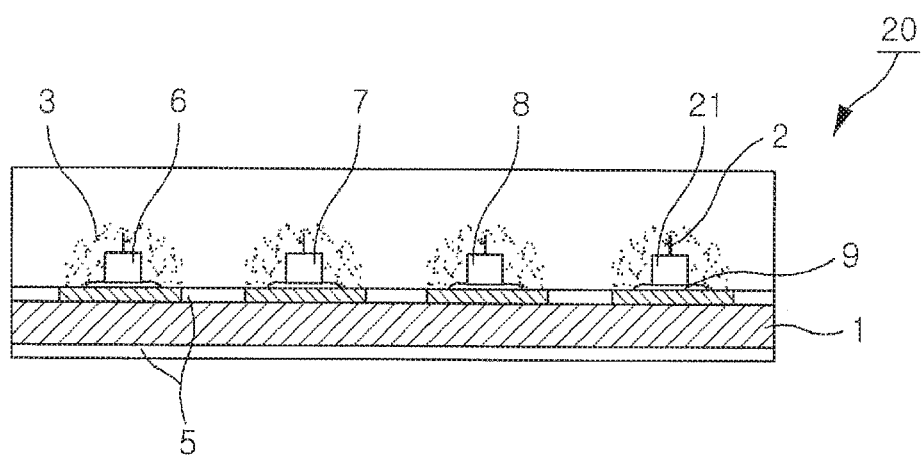

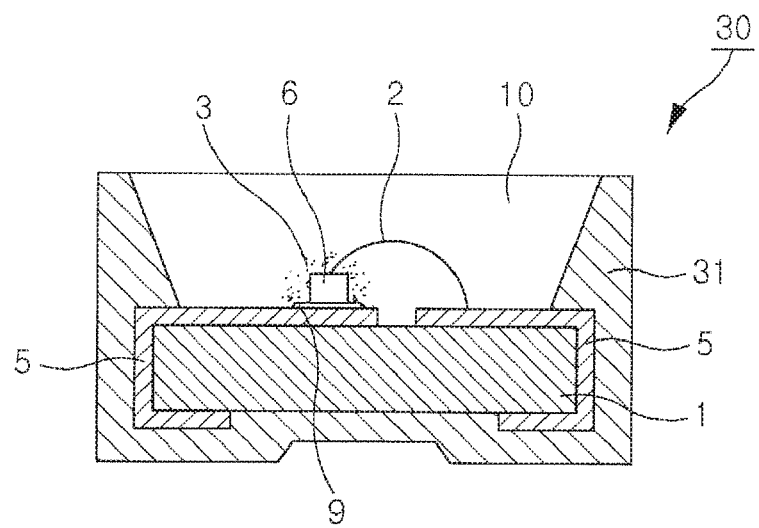
[Fig. 5]
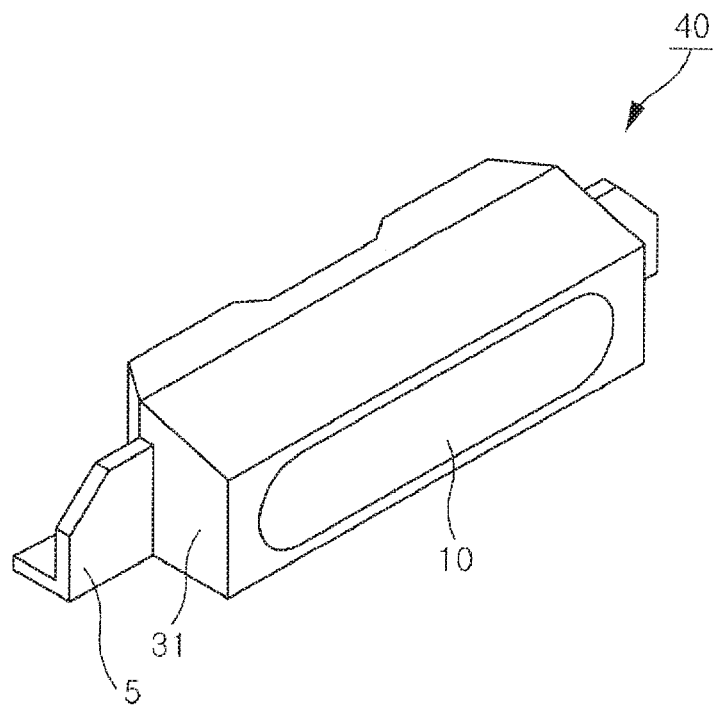
[Fig. 6]

[Fig. 7]
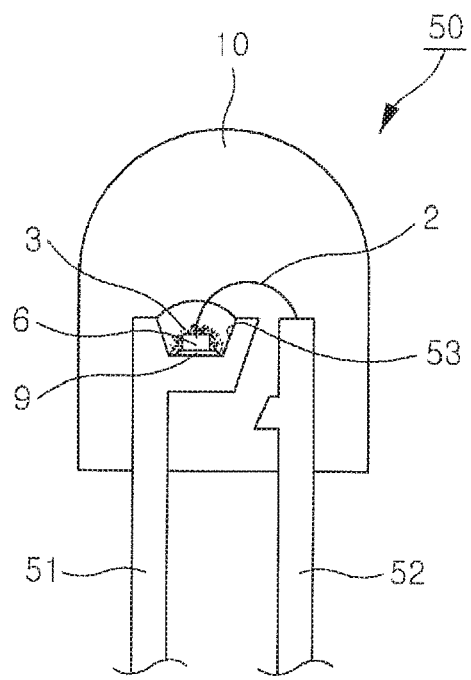
[Fig. 8]
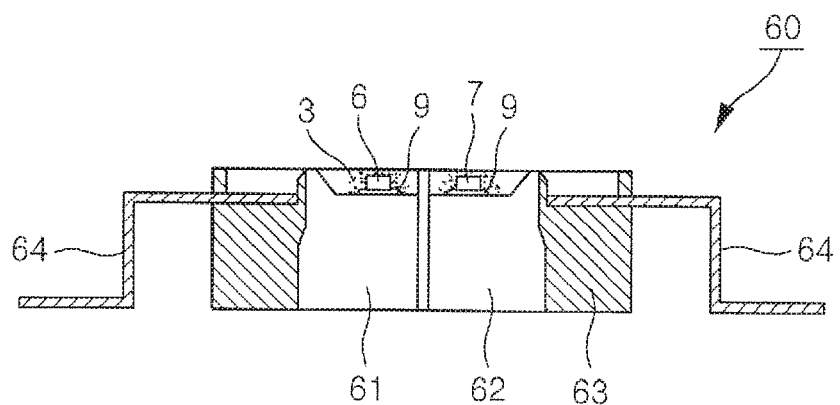
[Fig. 9]
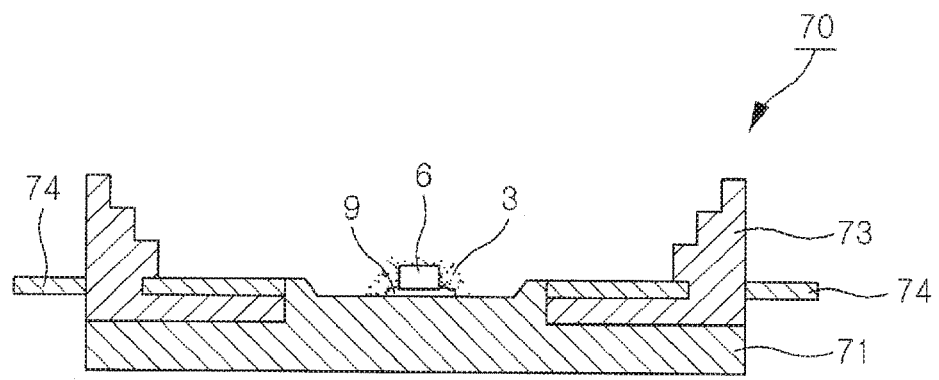

LIGHT EMITTING DEVICE INCLUDING RGB LIGHT EMITTING DIODES AND PHOSPHOR

CROSS REFERENCE TO RELATED APPLICATIONS

This application is a continuation of U.S. application Ser. No. 16/232,987, filed on Dec. 26, 2018, which is a Continuation of U.S. application Ser. No. 14/934,798, filed on Nov. 6, 2015, now issued as U.S. Pat. No. 10,186,648, which is a Continuation of U.S. application Ser. No. 11/569,060, filed on Jun. 22, 2007, now issued as U.S. Pat. No. 9,209,162, which is the National Stage Entry of International Patent Application No. PCT/KR2005/001288, filed on May 3, 2005, and claims priority from and the benefit of Korean Patent Application No. 2004-0034001, filed May 13, 2004, all of which are hereby incorporated by reference for all purposes as if fully set forth herein.

TECHNICAL FIELD

The present invention relates, in general, to a light emitting device (LED), and more particularly, to an LED, which comprises RGB (Red, Green, Blue) light emitting diodes and a wavelength-conversion means so as to exhibit a high color temperature and a high color rendering index, and thus, is suitable for use in apparatuses, such as home appliances, audio systems and communication products, and in various exterior and interior displays, automobiles and lighting fixtures.

BACKGROUND ART

Recently, an LED which emits white light has been fabricated to include a Ga(In)N light emitting diode which emits blue light at about 460 nm and a YAG:Ce.sup.3+ phosphor which emits yellow light (BY emission method, U.S. Pat. No. 5,998,925 and EP 862794). However, the LED for use in emission of white light is limitedly used, since it has a low color temperature of about 6,000 to 8,000 K and a low color rendering index of about 60-70 due to the absence of a predetermined color component (e.g., red).

Alternatively, white color is realized by mixing three red, green and blue colors (RGB emission method), which is disclosed in detail in WO 98/39805.

However, since the RGB light emitting diodes have different constitutive materials or properties to one another, their luminous intensities vary. Accordingly, it is impossible to actually reproduce all colors in a visible light wavelength range using the RGB emission method.

That is, red light, green light and blue light are sequentially shortened in wavelengths, and thus, the light emitting diodes have low luminous intensities due to the short wavelengths. As such, the red and green light emitting diodes have relatively higher luminous intensities than the blue light emitting diode. In recent years, the difference in relative luminous intensities of the light emitting diodes has further increased due to the techniques for fabricating LEDs. Consequently, white light for use in desired purposes, for example, lighting fixtures or automobiles, cannot be realized even by the RGB emission method using three RGB light emitting diodes having different wavelengths.

DISCLOSURE OF INVENTION

Technical Problem

Therefore, the present invention has been made keeping in mind the above problems occurring in the related art, and an object of the present invention is to provide an LED having a wavelength-conversion means, which is advantageous in that because it has a high color temperature of about 2,000 to 8,000 K or 10,000 K and a high color rendering index of 90 or more, it can be used in apparatuses such as home appliances, audio systems and communication products, and in various exterior and interior displays, automobiles and lighting fixtures.

Another object of the present invention is to provide an LED, which comprises light emitting diodes having narrow emission wavelength ranges and a phosphor so that yellow-green light or orange light having relatively wide emission wavelength ranges is emitted, thus realizing various colors in a visible light wavelength range and high color rendering ability.

Technical Solution

In order to achieve the above objects, the present invention provides an LED comprising at least three light emitting diodes having different peak emission wavelengths to primarily emit light in a blue, green or red wavelength range; and a wavelength-conversion means to convert the primary light into secondary light in a visible light wavelength range.

Preferably, the LED further comprises at least one light emitting diode to emit light in a blue and/or blue-green wavelength range.

In the LED, the at least three light emitting diodes comprise a first light emitting diode having a peak emission wavelength between 440 and 500 nm; a second light emitting diode having a peak emission wavelength between 500 and 570 nm; and a third light emitting diode having a peak emission wavelength between 570 and 670 nm. In addition, a fourth light emitting diode having a peak emission wavelength between 410 and 460 nm is further included.

As such, the wavelength-conversion means comprises a single phosphor or a mixture of phosphors. For example, the wavelength-conversion means includes any one selected from among a first phosphor having a peak emission wavelength between 450 and 520 nm, a second phosphor having a peak emission wavelength between 500 and 570 nm, a third phosphor having a peak emission wavelength between 570 and 680 nm, and mixtures thereof. Also, each phosphor consists of one or more phosphor components in the corresponding wavelength range.

In the LED, it is preferable that the light emitting diodes and the wavelength-conversion means be mounted in a single package. As such, the wavelength-conversion means is placed on at least one of an upper surface, a lower surface, and a side surface of the light emitting diode, or is mixed with a conductive adhesive or distributed in a molded part.

In the LED according to first and second embodiments, the single package is formed into a chip package, which comprises a substrate, one or more light emitting diodes mounted on the substrate, and a wavelength-conversion means placed around the light emitting diodes.

In the LED according to third and fourth embodiments, the single package is formed into a top package, which comprises a substrate having a reflector formed thereon, one or more light emitting diodes mounted on the substrate, and a wavelength-conversion means placed around the light emitting diodes.

In the LED according to the first to fourth embodiments, the substrate is formed of metal to emit heat generated by the one or more light emitting diodes. Also, when the LED further comprises a radiation sheet mounted on the substrate formed of metal, its heat emission efficiency is further increased.

In the LED according to the first to fourth embodiments, the LED further comprises a molded part to enclose the light emitting diodes and the wavelength-conversion means on the substrate, in which the wavelength-conversion means may be uniformly distributed in the molded part.

In the LED according to a fifth embodiment, the single package is formed into a lamp package, which comprises a pair of lead electrodes, one or more light emitting diodes mounted on one of the pair of lead electrodes, a wavelength-conversion means placed around the light emitting diodes, and a molded part to enclose the light emitting diodes and the wavelength-conversion means.

In the LED according to sixth and seventh embodiments, the single package is formed into a high output package, which comprises one or more light emitting diodes, a wavelength-conversion means placed around the light emitting diodes, and a heat sink to emit heat generated by the one or more light emitting diodes. As such, when the radiation sheet is further attached on the heat sink, heat is effectively emitted.

Used in the present invention, the light emitting diodes each include a substrate formed of silicon carbide or sapphire and a nitride epitaxial layer formed on the substrate.

DESCRIPTION OF DRAWINGS

The above and other objects, features and other advantages of the present invention will be more clearly understood from the following detailed description taken in conjunction with the accompanying drawings, in which:

FIG. 1 is a longitudinal sectional view schematically showing an LED according to a first embodiment of the present invention, in which the LED is formed into a chip package comprising three light emitting diodes and a wavelength-conversion means;

FIG. 2 is a graph showing the emission spectrum of the LED including RGB light emitting diodes and a phosphor emitting orange light, according to the first embodiment of the present invention;

FIG. 3 is a graph showing the emission spectrum of the LED including RB light emitting diodes, two phosphors having different peak emission wavelengths, and a phosphor emitting orange light, according to the first embodiment of the present invention;

FIG. 4 is a longitudinal sectional view schematically showing an LED according to a second embodiment of the present invention, in which the LED is formed into a chip package comprising four light emitting diodes and a wavelength-conversion means;

FIG. 5 is a longitudinal sectional view schematically showing a top package, according to a third embodiment of the present invention;

FIG. 6 is a perspective view showing a side package, according to a fourth embodiment of the present invention;

FIG. 7 is a longitudinal sectional view schematically showing a lamp package, according to a fifth embodiment of the present invention;

FIG. 8 is a longitudinal sectional view schematically showing a high output package, according to a sixth embodiment of the present invention; and FIG. 9 is a longitudinal sectional view schematically showing a high output package, according to a seventh embodiment of the present invention.

BEST MODE

Hereinafter, a detailed description will be given of preferred embodiments of the present invention, with reference to the appended drawings.

FIG. 1 is a longitudinal sectional view schematically showing an LED according to a first embodiment of the present invention, in which a chip package including three light emitting diodes and a wavelength-conversion means is shown. As shown in the drawing, a substrate 1 has electrode patterns 5 formed on both surfaces thereof, and three light emitting diodes 6, 7 and 8 to primarily generate light having different wavelengths are mounted on either electrode pattern 5. The light emitting diodes 6, 7 and 8 are mounted on the electrode pattern 5 using a conductive adhesive 9, and electrodes of the light emitting diodes 6, 7 and 8 are connected to another electrode pattern (not shown) by means of a conductive wire 2.

A wavelength-conversion means 3 is placed on upper surfaces and side surfaces of the three light emitting diodes 6, 7 and 8. The wavelength-conversion means 3 functions to convert light generated by the light emitting diodes 6, 7 and 8 into secondary light in the visible light wavelength range. The wavelength-conversion means 3 mixed with a thermosetting resin, for example, an epoxy resin or a silicone resin may be dotted on the light emitting diodes 6, 7 and 8.

In addition, the wavelength-conversion means 3 mixed with the conductive adhesive 9 may be placed on the lower surfaces of the light emitting diodes 6, 7 and 8.

An upper portion of the substrate 1 having the three light emitting diodes 6, 7 and 8 mounted thereon is molded using the thermosetting resin to form a molded part 10. In the LED 11 according to the first embodiment of the present invention, the wavelength-conversion means 3 is uniformly dotted on the upper surfaces and side surfaces of the light emitting diodes 6, 7 and 8 at a predetermined thickness. Alternatively, the wavelength-conversion means 3 may be uniformly distributed throughout the molded part 10, which is disclosed in U.S. Pat. No. 6,482,664 filed by the present inventors.

Of the three light emitting diodes 6, 7 and 8, a first light emitting diode 6 has a peak emission wavelength between 440 and 500 nm, a second light emitting diode 7 has a peak emission wavelength between 500 and 570 nm, and a third light emitting diode 8 has a peak emission wavelength between 570 and 670 nm. The first light emitting diode 6 emits light in the purple blue to blue wavelength range, and the second light emitting diode 7 emits light in the green to yellow green wavelength range. Also, the third light emitting diode 8 emits light in the greenish yellow to red wavelength range. The first, second and third light emitting diodes 6, 7 and 8 each include a substrate made of silicon carbide or sapphire and a nitride epitaxial layer formed on the substrate.

The wavelength-conversion means 3 includes a single phosphor or a mixture of different phosphors. That is, the wavelength-conversion means 3 includes at least one phosphor selected from among a first phosphor having a peak emission wavelength between 450 and 520 nm, a second phosphor having a peak emission wavelength between 500 and 570 nm, and a third phosphor having a peak emission wavelength between 570 and 680 nm, in which the first phosphor emits blue light, the second phosphor emits green to yellow light, and the third phosphor emits yellow to red light. In addition, each phosphor may consist of one or more phosphor components having different peak emission wavelengths in the corresponding wavelength range.

The phosphor of the wavelength-conversion means 3 is composed of silicates represented by a general formula of $(Ba,Sr,Ca)_xSiO_4$:Eu and/or Mn. As such, the mixing ratio of Ba, Sr and Ca, the mixing ratio $(Ba,Sr,Ca)_xSiO_4$:Eu and $(Ba,Sr,Ca)_xSiO_4$:Eu, and the mixing ratio of Ba, Sr, Ca, Mn and Eu are appropriately controlled to obtain the first phosphor having a peak emission wavelength between 450 and 520 nm, the second phosphor having a peak emission wavelength between 500 and 570 nm, or the third phosphor having a peak emission wavelength between 570 and 680 nm. In this way, the phosphors are mixed with each other at an appropriate ratio to constitute the wavelength-conversion means 3.

In the LED 11 according to the first embodiment, the first light emitting diode 6, the second light emitting diode 7 and the third light emitting diode 8 are supplied with external power by means of the electrode pattern 5. Thereby, light having a peak emission wavelength between 450 and 520 nm and light having a peak emission wavelength between 500 and 570 nm are primarily generated by the first light emitting diode 6 and the second light emitting diode 7, respectively. In addition, light having a peak emission wavelength between 570 and 680 nm is primarily generated by the third light emitting diode 8. Subsequently, while the phosphors are excited by light generated by the light emitting diodes 6, 7 and 8, secondary light having peak emission wavelengths between 450 and 520 nm, between 500 and 570 nm, and/or between 570 and 680 nm is produced.

Hence, in the LED 11, the primary light generated by the first, second and third light emitting diodes 6, 7 and 8 is combined with the secondary light converted into predetermined wavelengths by the phosphors to realize the color of the corresponding visible light wavelength range. Further, the desired color is realized by appropriately controlling the mixing ratios of the phosphors.

For example, in the case where the first phosphor having a peak emission wavelength between 450 and 520 nm and the second phosphor having a peak emission wavelength between 500 and 570 nm are used, secondary light ranging from 570 to 680 nm is not generated. Hence, the primary light emitted by the two light emitting diodes is combined with the secondary light converted into predetermined wavelengths by the phosphors, thus realizing another color in the visible light wavelength range. In addition to the mixing ratios of the phosphors, the light emitting diodes having desired peak emission wavelengths in the corresponding wavelength ranges may be appropriately selected to achieve the desired emission on the color coordinate system.

Therefore, when the three RGB light emitting diodes 6, 7 and 8, having different wavelengths, are used along with a wavelength-conversion means emitting orange light, the LED having the emission spectrum shown in FIG. 2 is manufactured. Such an LED has a color temperature of 2,500 to 3,000 K and a color rendering index of about 98. In the present embodiment, the light emitting diodes and the phosphors are appropriately selected so that the desired emission on the color coordinate system can be easily achieved.

For example, when the RB light emitting diodes are used together with the three kinds of phosphors having wavelengths corresponding to orange, first green and second green light, the LED has the emission spectrum shown in FIG. 3. In this case, the LED has a color temperature of about 3,000 K and a color rendering index of about 96.

In addition, the light emitting diodes and the phosphors constituting the wavelength-conversion means may be appropriately selected. For example, FIG. 4 is a longitudinal sectional view schematically showing an LED according to a second embodiment of the present invention, in which a chip package including four light emitting diodes and a wavelength-conversion means is shown.

The LED according to the second embodiment of the present invention has the same structure as in the first embodiment of FIGS. 1 to 3, with the exception that one light emitting diode is further included. A fourth light emitting diode has a peak emission wavelength between 410 and 460 nm and thus emits purple blue light.

In the LED 20, when the first, second, third and fourth light emitting diodes 6, 7, 8 and 21 are supplied with external power by means of the electrode pattern 5, they primarily produce light at the corresponding peak emission wavelengths. Subsequently, primary light is partially converted into secondary light, having peak emission wavelengths between 450 and 520 nm, between 500 and 570 nm, and between 570 and 680 nm, by the excited phosphors. In this case, the primary light emitted by the light emitting diodes 6, 7, 8 and 21 is combined with the secondary light converted into predetermined wavelengths by the phosphors to emit light in the visible light wavelength range.

As such, each phosphor may consist of one or more phosphor components having different peak emission wavelengths in the corresponding wavelength range. In addition, the mixing ratios of the phosphors are appropriately controlled, and thus, the emission wavelength may be shifted into a desired emission wavelength on the color coordinate system.

In the LED 20 according to the second embodiment, the same objects and effects as in the first embodiment of FIGS. 1 and 2 are achieved. The LEDs 11 and 20 according to the first and second embodiments of the present invention have a high color temperature and excellent color rendering properties, and thus, can be applied to electronic products, such as home appliances, audio systems and communication products, and as well, various exterior and interior displays, in particular, automobiles and lighting fixtures.

The technical characteristics of the present invention, concerning FIGS. 1 to 4, are not limited only to the chip package, and may be applied to various LED packages, thus achieving the same objects and effects.

Hereinafter, the embodiments wherein the present techniques are applied to various LED packages are described, with reference to the appended drawings, in which the same reference numerals are used throughout the different drawings to designate the same components and structures as in FIGS. 1 to 4, and the technical principles relating to the light emitting diodes and the wavelength-conversion means are similarly applied.

FIG. 5 is a longitudinal sectional view of a top package, according to a third embodiment of the present invention. The top package 30, which is an LED for use in a backlight unit for displays, has almost the same structure as the LEDs according to the first and second embodiments, with the exception that a reflector 31 is mounted on the substrate. The reflector 31 functions to reflect light emitted by the light emitting diode 6 in a desired direction.

The top package 30 includes three light emitting diodes 6, 7 and 8 or four light emitting diodes 6, 7, 8 and 21, each of which has different peak emission wavelengths.

Further, the top package 30 may be provided with the wavelength-conversion means 3, including a plurality of phosphors having different emission wavelengths, which are mixed with each other at one of various ratios. Such a wavelength-conversion means 3 may be dotted on the light emitting diode 6 in the reflector 31 or uniformly distributed in the thermosetting resin molded part 10.

FIG. 6 is a perspective view showing a side package according to a fourth embodiment of the present invention. The side package 40 has almost the same structure as the top package of FIG. 5, with the exception that its outer appearance is shaped in a very thin rectangle. A detailed description of the side package 40 according to the fourth embodiment refers to the description related to FIG. 5.

In the embodiments shown in FIGS. 1 to 6, the substrate 1 formed of metal having high heat conductivity is used to readily emit heat generated when operating the light emitting diodes 6, 7, 8 and 21. Thereby, a high output LED can be obtained. Further, when a radiation sheet (not shown) is additionally attached on the substrate, heat may be effectively radiated from the light emitting diodes 6, 7, 8 and 21.

FIG. 7 is a longitudinal sectional view showing a lamp package according to a fifth embodiment of the present invention. The lamp package 50 includes a pair of lead electrodes 51 and 52. In addition, a diode holder 53 is formed at an upper end of the lead electrode 51. The diode holder 53 is cup-shaped, in which three light emitting diodes 6, 7 and 8 or four light emitting diodes 6, 7, 8 and 21 are mounted. The light emitting diodes 6, 7, 8 and 21 have different peak emission wavelengths, as in the above embodiments. The electrodes of the light emitting diodes 6, 7, 8 and 21 are connected to the other lead electrode 52 by means of the conductive wire 2.

The inner wall of the cup-shaped holder 53 is coated with an epoxy resin 54 mixed with a predetermined amount of wavelength-conversion means 3. The wavelength-conversion means 3 includes a plurality of phosphors having different peak emission wavelengths, which are mixed with each other at an appropriate ratio, as in the above embodiments.

Further, each phosphor may consist of one or more phosphor components having predetermined peak emission wavelengths in the corresponding wavelength range.

The outer portion of the diode holder 53 including the light emitting diodes 6, 7 and 8 or 6, 7, 8 and 21 and the wavelength-conversion means 3 is molded with the thermosetting resin, for example, epoxy or silicone.

FIG. 8 is a longitudinal sectional view schematically showing a high output package according to a sixth embodiment of the present invention. The high output package 60 includes a plurality of separate heat sinks 61 and 62 on which the light emitting diodes 6, 7 and 8 or 6, 7, 8 and 21 are mounted, and a housing 63 in which the wavelength-conversion means 3 is placed on the upper surfaces and side surfaces of the light emitting diodes 6 and 7. A plurality of lead frames 64 to which external power is supplied protrude externally from the housing 63.

FIG. 9 is a longitudinal sectional view schematically showing a high output package according to a seventh embodiment of the present invention. In the package 70, a single heat sink 71 is partially received in a housing 73 to be exposed. Also, a pair of lead frames 74 protrudes externally. The light emitting diodes 6, 7 and 8 or 6, 7, 8 and 21 are mounted on the heat sink 71 and connected to the lead frames 74 through the conductive wire (not shown). In addition, the wavelength-conversion means 3 is placed on the upper surface and side surfaces of the light emitting diode 6.

In the high output package 60 or 70 according to the sixth and seventh embodiments of the present invention, the wavelength-conversion means 3 is placed at an adhesion portion between the heat sinks 61 and 62 or 71 and the light emitting diodes 6, 7 and 8 or 6, 7, 8 and 21. A lens may be mounted on the housing 63 or 73. The package 70 according to the seventh embodiment is advantageous because its height can be minimized, compared to the package 60 according to the sixth embodiment.

In the case where the three light emitting diodes 6, 7 and 8 are included in the high output package 60 or 70, the first light emitting diode having a peak emission wavelength between 440 and 500 nm, the second light emitting diode having a peak emission wavelength between 500 and 570 nm and the third light emitting diode having a peak emission wavelength between 570 and 670 nm may be used.

In the case where the four light emitting diodes 6, 7, 8 and 21 are included, the first light emitting diode has a peak emission wavelength between 440 and 500 nm, the second light emitting diode has a peak emission wavelength between 500 and 570 nm, the third light emitting diode has a peak emission wavelength between 570 and 670 nm, and the fourth light emitting diode has a peak emission wavelength between 410 and 460 nm.

In the cases of using three or four light emitting diodes, the wavelength-conversion means 3 includes a first phosphor having a peak emission wavelength between 450 and 520 nm, a second phosphor having a peak emission wavelength between 500 and 570 nm, and a third phosphor having a peak emission wavelength between 570 and 680 nm, which are mixed with each other at an appropriate ratio.

In the high output package 60 or 70, it is preferable that the radiation sheet (not shown) be separately or integrally mounted on the heat sinks 61 and 62 or 71. Then, when each light emitting diode is operated by high input power, heat generated by each light emitting diode can be effectively emitted. The radiation sheet may be cooled by means of passive air circulation or forcible circulation using a fan.

In the high output package 60 or 70, when external power is supplied, each light emitting diode primarily emits light at the corresponding peak wavelengths. Then, while the phosphors are excited by primary light, they produce secondary light at the corresponding peak emission wavelengths. At this time, the primary light generated by each light emitting diode is combined with the secondary light converted into pre-determined wavelengths by the phosphors to realize the color of the corresponding visible light wavelength range. Further, when the mixing ratios of the phosphors are appropriately controlled, the desired color on the color coordinate system can be easily realized.

Although the preferred embodiments of the present invention have been disclosed for illustrative purposes using three or four light emitting diodes, those skilled in the art will appreciate that various modifications, additions and substitutions are possible by using at least one light emitting diode, without departing from the scope and spirit of the invention as disclosed in the accompanying claims.

INDUSTRIAL APPLICABILITY

As described hereinbefore, the present invention provides an LED having a relatively high color temperature of 2,000 to 8,000 K or 10,000 K and a high color rendering index of 90 or more, by appropriately controlling the mixing ratios of the phosphors having different peak emission wavelengths or selectively using the light emitting diodes having different peak emission wavelengths. Further, the light emitting diode having a narrow emission wavelength range is used along with the phosphor, and thus, yellow-green light or orange light having a relatively wide emission wavelength range can be emitted. Thereby, various colors in the visible light wavelength range and excellent color rendering properties are manifested.

Since the LED of the present invention having high color temperature and excellent color rendering properties functions to easily realize the desired emission on the color coordinate system, it can be variously applied to mobile phones, notebook computers, and keypads or backlight units for various electronic products. In particular, the LED can be used for automobiles and exterior and interior lighting fixtures.

What is claimed is:

1. A light emitting device, comprising:
   a plurality of light emitting diodes having different peak emission wavelengths to primary light;
   a molded part encapsulating the plurality of light emitting diodes; and
   a wavelength converter configured to convert the primary light into secondary light in a visible light wavelength range, the wavelength converter being disposed in the molded part,
   wherein:
   the wavelength converter includes a mixture of different phosphors and comprises a first phosphor having a first peak emission wavelength, a second phosphor having a second peak emission wavelength, and a third phosphor having a third peak emission wavelength;
   two of the first, second, and third phosphors have different peak emission wavelengths in at least one color range; and
   the plurality of light emitting diodes are configured to emit blue primary light having first and second peak emission wavelength ranges, in which the first peak emission wavelength range is between 410 nm and 460 nm, and the second peak emission wavelength range is between 440 nm and 500 nm.

2. The light emitting device of claim 1, wherein the light emitting device has a color temperature range of 2,000 K to 10,000 K.

3. The light emitting device of claim 1, wherein the light emitting device has a color temperature of about 3,000 K and a color rendering index of more than 96.

4. The light emitting device of claim 1, wherein two of the first, second, and third phosphors have different peak emission wavelengths in a color range between 570 nm and 680 nm.

5. The light emitting device of claim 4, wherein the single package is formed into a chip package comprising a substrate, one or more light emitting diodes mounted on the substrate, and a wavelength converter placed around the light emitting diodes.

6. The light emitting device of claim 4, wherein the single package is formed into a top package comprising a substrate having a reflector formed thereon, one or more light emitting diodes mounted on the substrate, and a wavelength converter placed around the light emitting diodes.

7. The light emitting device of claim 1, wherein the plurality of light emitting diodes and the wavelength converter are mounted in a single package.

8. The light emitting device of claim 1, wherein the wavelength converter is placed on at least one of an upper surface, a lower surface, and a side surface of the plurality of light emitting diodes, or is mixed with a conductive adhesive or distributed in a molded part.

9. The light emitting device of claim 8, wherein the substrate is formed of metal to emit heat generated by the one or more light emitting diodes.

* * * * *